(12) United States Patent
Siprak

(10) Patent No.: US 8,431,468 B2
(45) Date of Patent: Apr. 30, 2013

(54) NOISE REDUCTION IN SEMICONDUCTOR DEVICES

(75) Inventor: Domagoj Siprak, Munich (DE)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 12/895,401

(22) Filed: Sep. 30, 2010

(65) Prior Publication Data

US 2011/0020997 A1 Jan. 27, 2011

Related U.S. Application Data

(63) Continuation of application No. 11/635,709, filed on Dec. 7, 2006, now abandoned.

(51) Int. Cl.
*H01L 21/26* (2006.01)

(52) U.S. Cl.
USPC .................................. 438/513; 257/E21.143

(58) Field of Classification Search .................. 438/513, 438/516, 528, 918; 257/E21.143
See application file for complete search history.

(56) References Cited

U.S. PATENT DOCUMENTS

| | | | |
|---|---|---|---|
| 5,514,879 A | | 5/1996 | Yamazaki |
| 5,605,848 A | | 2/1997 | Ngaoaram |
| 5,989,948 A | * | 11/1999 | Vines et al. .................... 438/216 |
| 6,288,433 B1 | * | 9/2001 | Akram et al. ................. 257/408 |
| 6,376,303 B1 | | 4/2002 | Seo et al. |
| 6,661,065 B2 | | 12/2003 | Kunikiyo |
| 6,825,133 B2 | | 11/2004 | Yu et al. |
| 6,849,515 B1 | | 2/2005 | Taylor, Jr. et al. |
| 7,002,224 B2 | | 2/2006 | Li |
| 7,018,880 B2 | | 3/2006 | Hao et al. |
| 2002/0109177 A1 | | 8/2002 | D'Souza et al. |
| 2004/0106260 A1 | | 6/2004 | Lei et al. |
| 2004/0129969 A1 | | 7/2004 | Colombo et al. |
| 2005/0087804 A1 | | 4/2005 | Furukawa |
| 2005/0167764 A1 | | 8/2005 | Li |
| 2006/0063361 A1 | * | 3/2006 | Kumar et al. ................. 438/513 |
| 2006/0105530 A1 | | 5/2006 | Lai et al. |
| 2008/0135953 A1 | | 6/2008 | Siprak |

FOREIGN PATENT DOCUMENTS

| | | |
|---|---|---|
| EP | 1531496 A2 | 5/2005 |
| JP | 2006114747 | 4/2006 |

OTHER PUBLICATIONS

"U.S. Appl. No. 11/635,709, Response filed Apr. 15, 2010 to Non Final Office Action mailed Dec. 15, 2009", 17 pgs.

"U.S. Appl. No. 11/635,709, Restriction Requirement mailed Jun. 10, 2010", 6 pgs.

"U.S. Appl. No. 11/635,709, Non-Final Office Action mailed Dec. 15, 2009", 12 Pgs.

"U.S. Appl. No. 11/635,709, Response to Restriction Requirement mailed Sep. 9, 2009", 11.

"U.S. Appl. No. 11/635,709, Restriction Requirement mailed Sep. 9, 2009", 10 Pgs.

(Continued)

*Primary Examiner* — Chandra Chaudhari

(74) *Attorney, Agent, or Firm* — Schwegman, Lundberg & Woessner, P.A.

(57) ABSTRACT

An integrated circuit and method of making it, includes a semiconductor substrate and a support layer disposed on the semiconductor substrate. A gate insulator including a support layer doped using a noise-reducing dopant can be disposed on the semiconductor substrate. A gate stack can be disposed on the gate insulator.

26 Claims, 6 Drawing Sheets

OTHER PUBLICATIONS

"German Application No. 102007058676.2, Office Action Mailed Apr. 22, 2009", 7 pgs.

Fu, Horng-Sen, et al., "Theory and Experiments on Surface 1/f Noise", IEEE Transactions on Electron Devices ED-19(2), (Feb. 1972), 273-285.

Inoue, M., et al., "Fluorine incorporation into HfSiON dielectric for $V_{th}$ control and its impact on reliability for poly-Si gate pFET", IEDM Technical Digest. IEEE International Electron Devices Meeting, 2005., (2005), 413-416.

Kolhatkar, J. S., et al., "Constant and Switched Bias Low Frequency Noise in p-MOSFETs with Varying Gate Oxide Thickness", ESSDERC, (2002), 83-86.

Kundu, T, et al., "Enhanced $SiO_2$ reliability on deuterium-implanted silicon", IEEE Transactions on Device and Materials Reliability, 6(2), (2006), 288-291.

"U.S. Appl. No. 11/635,709 Final Office Action mailed Sep. 29, 2010", 11 pgs.

"U.S. Appl. No. 11/635,709, Final Office Action mailed Jul. 6, 2011", 12 pgs.

"U.S. Appl. No. 11/635,709, Non Final Office Action mailed Mar. 9, 2011", 8 pgs.

"U.S. Appl. No. 11/635,709, Preliminary Amendment filed Dec. 7, 2006", 3 pgs.

"U.S. Appl. No. 11/635,709, Response filed Jan. 27, 2011 to Final Office Action mailed Sep. 29, 2010", 12 pgs.

"U.S. Appl. No. 11/635,709, Response filed Jun. 9, 2011 to Non Final Office Action mailed Mar. 9, 2011", 12 pgs.

"U.S. Appl. No. 11/635,709, Response filed Jul. 12, 2010 to Restriction Requirement mailed Jun. 10, 2010", 13 pgs.

"German Application Serial No. 102007058676.2, Response filed Jul. 20, 2009 to Office Action mailed Mar. 20, 2009", 11 pgs.

"German Application Serial No. 102007058676.2, Summons to Attend Oral Proceedings mailed Jul. 13, 2011", 7 pgs.

\* cited by examiner

NOISE REDUCTION IN SEMICONDUCTOR DEVICES

PRIORITY INFORMATION

This application is a continuation of and claims the benefit of priority under 35 U.S.C. §120 to Siprak, U.S. patent application Ser. No. 11/635,709, entitled "NOISE REDUCTION IN SEMICONDUCTOR DEVICES," filed on Dec. 7, 2006, published as U.S. Patent Application Publication No. 2008/0135953 A1 on Jun. 12, 2008, which application and publication are hereby incorporated by reference herein in their entirety.

TECHNICAL FIELD

Embodiments described herein relate generally to semiconductor devices and more particularly, to devices having reduced noise and methods of fabricating the same.

BACKGROUND

Flicker noise is a dominant noise source in metal oxide semiconductor field-effect transistor (MOSFET) devices at low frequencies. In battery-driven circuits where signal-to-noise ratio cannot be improved at the cost of power consumption, a reduction of flicker noise is desired. Additionally, flicker noise deteriorates the performance of RF circuits having low frequency flicker noise being mixed and translated to higher frequencies in devices such as frequency mixers and voltage controlled oscillators.

DETAILED DESCRIPTION

Figure 1A:
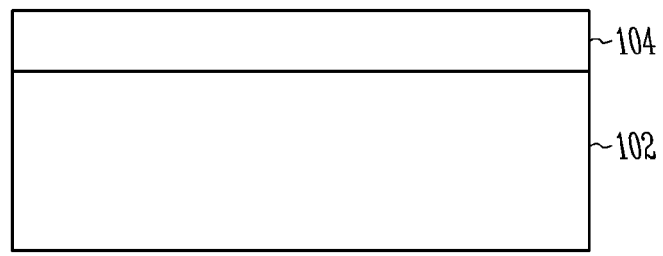
FIG. 1 illustrates a sequence of cross-sectional drawings of a partially completed semiconductor wafer showing a method of fabrication of a semiconductor wafer having a gate insulator formed using a high-k material and a support layer doped with a noise-reducing dopant, according to some embodiments of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the following description, the terms "wafer" and "substrate" may be used interchangeably to refer generally to any structure on which integrated circuits are formed and also to such structured during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

Implantation of fluorine into gate stacks formed by using high-k materials does not provide adequate reduction of flicker noise in such configurations. This is especially true in the case of RF circuits that manifests the presence of switched bias noise effect which can contribute to noise reduction. Switched bias noise effect is effective only in situations were traps are present further away from the substrate-oxide interface and by this way undergo larger potential variations of the traps during switching of the gate to source voltage in a MOSFET. Due to the reduced supply voltage available in circuits used in next generation applications, the potential variation of traps in the gate insulator during switching of the gate voltage is low. This leads to a decrease in noise reduction as a result of switched bias noise effect in next generation technology applications where thinner oxides are utilized and lower supply voltages are used. Consequently, alternate methods are necessary to reduce flicker noise generated in semiconductor devices.

The following disclosure relates in general to noise reduction in switching circuits such as RF circuits, however, it may not be limited to the same. Throughout this disclosure high-k material includes a material having a relative dielectric constant that is greater than the relative dielectric constant $\in_r$ of 3.9 for silicon dioxide. Throughout this disclosure the term noise reducing dopant includes an impurity introduced in a dielectric material to quench traps in the dielectric material and at the dielectric to substrate interface that cause trapping and emitting of charges from and to the conducting channel of a MOSFET.

FIGS. 1A-1H illustrate a sequence of cross-sectional drawings of a partially completed semiconductor wafer 100 showing a method of fabrication of a semiconductor wafer having a gate insulator formed using a high-k material and a support layer doped with a noise-reducing dopant, according to some embodiments of the invention.

FIG. 1A is a cross-sectional view through a partially completed semiconductor wafer 100 including a semiconductor substrate 102 and a screening oxide layer 104 formed over semiconductor substrate 102. In some embodiments, semiconductor substrate 102 includes a silicon layer. In other embodiments, the semiconductor substrate includes a silicon layer provided over a buried oxide layer. In some embodiments, the semiconductor substrate 102 includes a fin structured silicon layer in a bulk CMOS substrate or a fin structured silicon layer over a buried oxide. In some embodiments, screening oxide 104 includes silicon dioxide. As shown in FIG. 1A, screening oxide layer 104 is grown over the silicon surface prior to a doping process. In general, screening oxide layer 104 provides protection against unintended knock-on metallic contaminants (such as iron (Fe) and Nickel (Ni)) received from an ion implanter (not shown) used to implant a pre-selected noise-reducing dopant. In some embodiments, the thickness of the screening oxide layer can range from about 1 nm to 15 nm. In a preferred embodiment, the screening oxide would be around 3 nm.

Figure 1B:
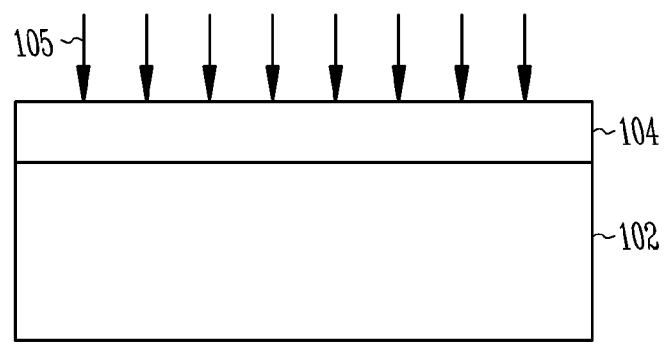

FIG. 1B is a cross-sectional view through the partially completed semiconductor wafer 100 shown in FIG. 1A illustrating the top surface of screening oxide layer 104 being exposed to an implantation process using implantation beam 105. Implantation beam 105 implants a pre-selected noise-reducing dopant into the semiconductor substrate 102.

In some embodiments, the noise-reducing dopants that may be used to dope semiconductor substrate 102 can be any one or combination of materials including Fluorine, Boron difluoride ($BF_2$), Boron trifluoride ($BF_3$), $PF_3$, $PF_5$, $AsF_3$, $AsF_5$, $SbF_3$, $SbF_5$, $XeF_2$, Xenon hexafluoride ($XeF_6$), SiF, Chlorine, Boron trichloride ($BCl_3$), $ClF_5$, $SiCl_4$, Deuterium, Hydrogen and their respective ions generated in a plasma including at least one fluorine, chlorine, deuterium or hydrogen atom.

Figure 1C:
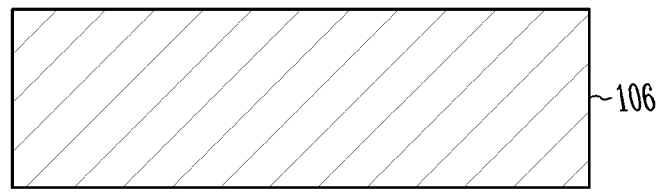

FIG. 1C is a cross-sectional view through the partially completed semiconductor wafer 100 shown in FIG. 1B illustrating the semiconductor substrate 102 implanted with the pre-selected noise-reducing dopant to form a doped semiconductor substrate 106. Additionally, screening oxide layer 104 is removed by using a wet dip process. In some embodiments, the wet dip process is performed using a Hydrogen Fluoride (HF) dip. Furthermore, in some embodiments, a cleaning process is performed using ammonia hydrogen peroxide water. In some embodiments, an anneal process is performed to heal crystal damage from implant into the substrate before disposing the support layer 108. This anneal can be done before or after the following described HF vapor clean.

Figure 1D:
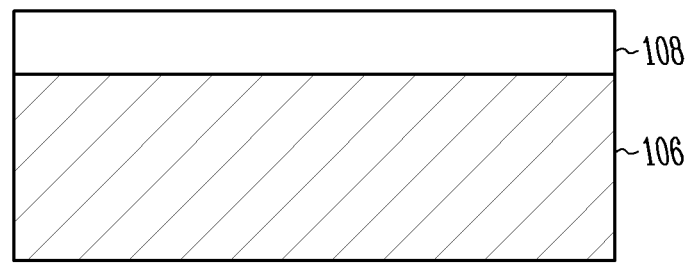

FIG. 1D is a cross-sectional view through the partially completed semiconductor wafer 100 shown in FIG. 1C illustrating doped semiconductor substrate 106 having a support layer 108 disposed over it. In some embodiments, the support layer 108 is formed using any one or combination of materials including silicon dioxide, nitrided silicon oxide and fluorinated silicon oxide. In some embodiments, prior to thermally growing the support layer 108, a cleaning process with HF vapor is performed to remove any kind of native oxide that may be formed on the surface of the substrate 106. This cleaning process is performed in the same chamber where the support layer is thermally grown.

In some embodiments, a high-temperature anneal, a process also called as densification is performed. This process allows for the diffusion of the noise-reducing dopants from the substrate to the substrate-support layer interface and into the support layer.

Figure 1E:
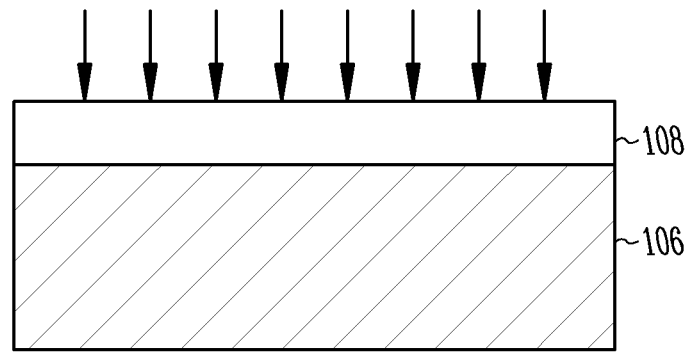

FIG. 1E is a cross-sectional view through the partially completed semiconductor wafer 100 shown in FIG. 1D illustrating doped semiconductor substrate 106 having a support layer 108 disposed over it and plasma 109 used to provide doping pre-selected noise-reducing dopants into support layer 108. In some embodiments, the noise-reducing dopants that may be used to dope support later 108 can be any one or combination of materials including Fluorine, Chlorine, $ClF_5$, $SiCl_4$, Hydrogen, Deuterium, $XeF_2$, Xenon hexafluoride ($XeF_6$) or $NF_3$. In some embodiments, a further anneal step may be provided to diffuse the noise reducing dopants to the substrate support layer interface.

In some embodiments, the doping dosage used for noise-reducing dopants such as Fluorine, Chlorine, Deuterium, Hydrogen is between about 1E14 atoms/cm$^2$ and about 1E16 atoms/cm$^2$. In some embodiments, the implant energy used is about 1 keV for shallow implants and about 100 keV for deep implants. In some embodiments, the implant dose and energy may have to be adjusted in situations where the noise reducing dopant used contains more than one of type of atom selected from Fluorine, Chlorine, Deuterium and Hydrogen atoms. Furthermore, as the number of noise reducing species available in a dopant mixture increases, the higher the implant energy that is required and lower the implant dose that is required, respectively.

In some embodiments, where a plasma process is used to dope the support layer, the concentration of noise reducing species in the support layer needs to reach the same amount as achieved by doping the substrate with noise reducing dopants and diffusing the noise reducing species of the dopant into the support layer through the substrate-support layer interface.

One of the advantages of introducing noise reducing dopants into substrate 106 as well as into the support layer 108 using a plasma doping process is that it provides for higher throughput during production of the semiconductor device. Additionally, a higher amount of introduced noise-reducing dopants is available in the device for noise reduction. In some embodiments, the use of materials such as BF2, BF3, PF3, AsF3, SbF3, PF5, AsF5, SbF5 to dope the substrate enhances the total amount of noise-reducing dopants available for introduction into the support layer when using a plasma process for doping the support layer.

Figure 1F:
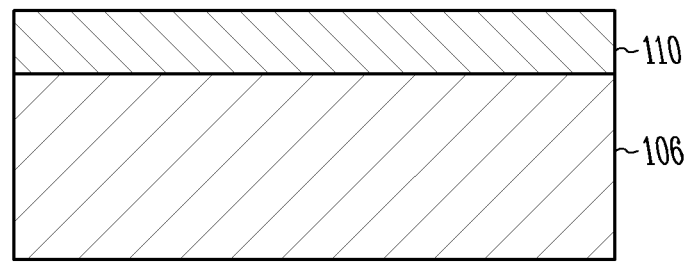

FIG. 1F is a cross-sectional view through a partially completed semiconductor wafer 100 shown in FIG. 1E illustrating the support layer 108 after the completion of the doping process which allows for noise-reducing dopants to be impregnated into support layer 108 thereby forming a doped support layer 110. In some embodiments, a further anneal step may be provided to diffuse the noise reducing dopants inside the support layer and into the substrate-support layer interface.

Figure 1G:

FIG. 1G is a cross-sectional view through a partially completed semiconductor wafer 100 shown in FIG. 1F illustrating a gate insulator layer 112 disposed over the doped support layer 110. In some embodiments, the gate insulator layer 112 includes a material having a higher dielectric constant compared to the doped support layer 110. In some embodiments, the gate insulator layer is formed using a material having a dielectric constant higher than the support layer.

Figure 1H:
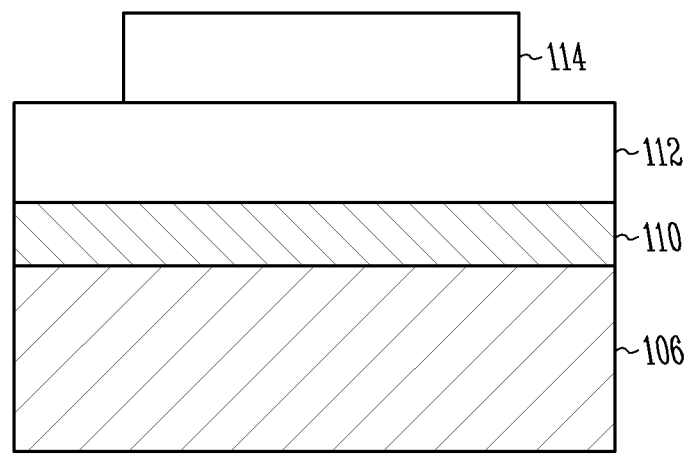

In some embodiments, the gate insulator includes any one or combination of materials having a high dielectric constant such as $Al_2O_3$, $GD_2O_3$, $Yb_2O_3$, $Dy_2O_3$, $Nb_2O_5$, $Yb_2O_3$, $La_2O_3$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, HfSiON, HfZrO, $Al_xZr_{1-x}O_2$. deposited by atomic layer deposition (ALD) or metal organic chemical vapor deposition (MOCVD). In some embodiments, the gate insulator may include a nitrided silicon oxide or silicon nitride $Si_3N_4$ FIG. 1H is a cross-sectional view through a partially completed semiconductor wafer 100 shown in FIG. 1G illustrating a gate stack layer 114 disposed over the gate insulator layer 112. In some embodiments, the gate insulator may include gates such as a poly silicon gate, poly silicon gate with a silicide on the top portion of the gate, a fully silicided gate and a metal gate. In some embodiments, a combination of the above mentioned gates may be used.

Figure 2:
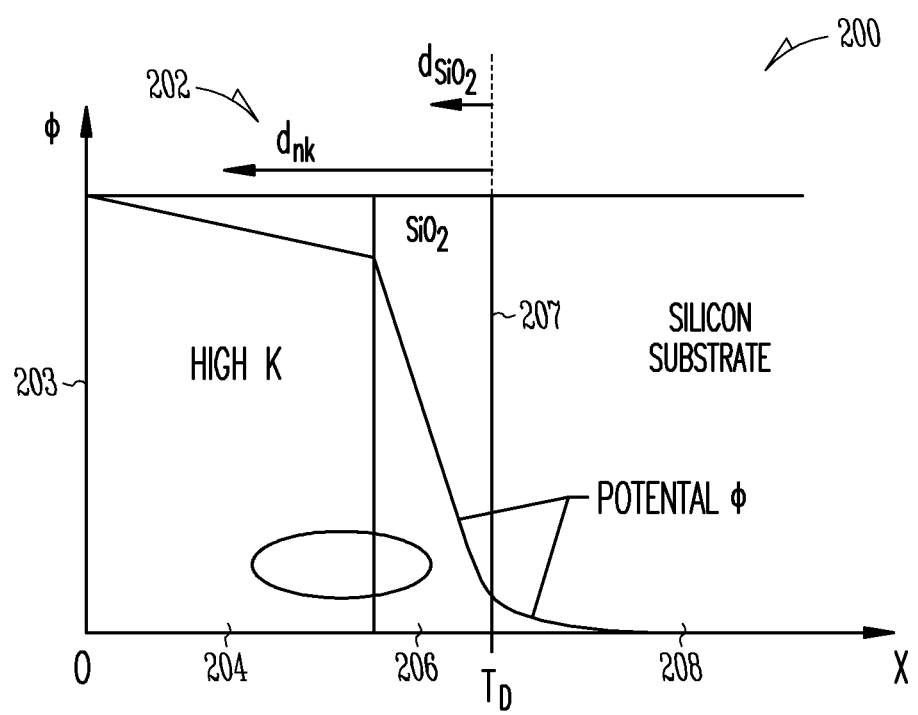
FIG. 2 illustrates a diagram showing the potential distribution within a dielectric stack with incorporated charges, according to some embodiments of the invention.

FIG. 2 illustrates a diagram 200 showing the potential distribution $\phi(x)$ within a dielectric stack with incorporated charges, according to some embodiments of the invention. Additionally, diagram 200 shows in general a potential distribution $\phi(x)$ for an NMOS device starting with a high potential at gate interface 203 to a lower potential at the substrate-oxide interface 207.

As shown in FIG. 2, a gate insulator stack 202 includes a high-k material layer 204 and a support layer 206. Gate insulator stack 202 extends from the gate interface 203 at position x=0 and passes through an area of high k material layer 204 and support layer 206 made of silicon dioxide or nitrided or fluorinated silicon oxide to the interface 207 situated in between silicon dioxide layer 206 and substrate 208. In alternate embodiments, support layer 206 can include either one or a combination of materials such as nitrided silicon oxide or fluorinated silicon oxide.

The following equations provide a description for the principle of achieving noise reduction by choosing an appropriate thickness of support layer 206 and the high-k material layer 204. In the following equations, the potential in the gate insulator stack 204 comprising high-k material layer 204 and support layer 206 is calculated for the case when charges from the conducting channel of a transistor are trapped inside the gate insulator and the support layer. As a consequence of the generated potential, the trapped charges change the charge in the conducting channel of the transistor and at the gate electrode. Additionally, the trapped charge changes the mobility of the channel charges by acting as a coulomb scattering center. Both effects lead to the channel current noise of a MOSFET.

In the following equations, the effect on mobility is neglected and only the effect of trapped charge on the channel charge of the conducting channel is considered. Solving the following equations addresses the question of how different charges at different positions in the gate insulator affects the channel charge. Also, the effect of a charge in the gate insulator at the substrate to oxide interface is calculated. In the following equations the support layer includes silicon dioxide.

The following equations show the derivation of a relationship for the ratio of the thickness of the support layer to the high-k gate layer that can be used for reducing the flicker noise generated in a gate stack that is disposed on a semiconductor wafer, according to one embodiments of the invention.

Equation-1: Poisson's Equation $$\frac{\partial^2 \phi}{\partial x^2} = -\frac{\rho(x)}{\varepsilon}, \quad \varepsilon = \varepsilon_0 \cdot \varepsilon_r$$

where,
$\phi$=Potential
$\rho(x)$=Charge Distribution
$\varepsilon$=Dielectric Constant
$\varepsilon_0$=8.854E-12 A*s/(V*m)
$\varepsilon_r$=relative dielectric constant Equation-2: Electric Field is given by the following equation, $$E = -\frac{\partial \phi}{\partial x}$$

Equation-3: Potential Difference is given by the following equation, $$\Delta \phi = \phi(X) - \phi(0) = \int_0^X \frac{\partial \phi}{\partial x} \cdot 1 \, dx = \frac{\partial \phi}{\partial x} \cdot x \bigg|_0^X - \int_0^X x \cdot \frac{\partial^2 \phi}{\partial x^2} dx$$

where,
X=distance from X=0 to a point X in the gate insulator,

Equation-4: Combining Equations 1, 2 and 3, $$\phi(0) = \phi(T_D) + E(T_D) \cdot T_D + \int_0^{T_D} x \cdot \frac{\rho(x)}{\varepsilon} dx$$

where,
$T_D$=Total thickness of the gate insulator including the support layer,

Equation-5: First case, where a number of channel electrons are trapped at the substrate-oxide interface 207 (in FIG. 2) and is given by the following equation:

$$\phi(0) = \phi(T_D) + E(T_D) \cdot T_D - N_s \cdot \frac{q}{\varepsilon_0 \cdot \varepsilon_{SiO2}} \cdot T_D$$

where,
$\varepsilon_{SiO2}$=dielectric constant of $SiO_2$ layer,
$N_s$=Number of trapped electrons at the substrate oxide interface,
q=1.602E-19 coulombs Equation-6: Second case, where a number of electrons $N_t(SiO_2)$ are trapped in the silicon dioxide support layer 206 having distance $d_{SiO2}$ from substrate-oxide interface as a dirac delta distribution and is given by the following equation:

$$\phi(0) = \phi(T_D) + E(T_D) \cdot T_D - N_t(SiO_2) \cdot \frac{q}{\varepsilon_0 \cdot \varepsilon_{SiO2}} \cdot (T_D - d_{SiO2})$$

where,
$N_t(SiO_2)$=Number of trapped electrons in the silicon dioxide layer,
$d_{SiO2}$=distance of the electrons in the silicon dioxide layer from the substrate-oxide interface Equation-7: Third case, where a number of electrons Nt(hk) electrons are trapped in high-k material having distance $d_{hk}$ from substrate-oxide interface as a dirac delta distribution and is given by the following equation:

$$\phi(0) = \phi(T_D) + E(T_D) \cdot T_D - N_t(hk) \cdot \frac{q}{\varepsilon_0 \cdot \varepsilon_{hk}} \cdot (T_D - d_{hk})$$

where,
$N_t$=Number of trapped electrons in the high-k layer,
$d_{hk}$=distance of the electrons in the high-k layer from the substrate-oxide layer, Equation-8: From Equations 5 & 6, it can be deduced that the effective charge at the substrate-oxide interface may be given by the following equation:

$$N_s(\text{eff } SiO_2) = N_t(SiO_2) \cdot \left(1 - \frac{d_{SiO2}}{T_D}\right)$$

where,
$N_s(\text{eff } SiO_2)$=is the charge in the silicon dioxide layer that is effective at the substrate-oxide interface (or that produces the same effect as an equivalent charge at the substrate-oxide interface), Equation-9: From Equations 5 & 7, it can be deduced that the effective charge at the substrate-oxide interface generated by charges in the high-k layer may be given by the following equation:

$$N_s(\text{eff } hk) = N_t(hk) \cdot \frac{\varepsilon_{SiO2}}{\varepsilon_{hk}} \cdot \left(1 - \frac{d_{hk}}{T_D}\right)$$

Equation-10: Spectral noise power density $S_{id}$ of drain current generated by trap distribution p in the oxide is given by the following equation. Here, it must be noted that the frequency contribution of traps is neglected.

$$S_{id} = (SiO_2) \sim \int_0^{d_{SiO2}} \left(1 - \frac{x}{T_D}\right)^2 \cdot \rho_{SiO2}(x) dx$$

where, $S_{id}$ ($SiO_2$)=Spectral noise power density of drain current generated by trap distribution p in the silicon dioxide layer Equation-11: Spectral noise power density $S_{id}$ of drain current generated by trap distribution p in the high-k (neglecting frequency contribution of traps) is given by the following equation:

$$S_{id}(hk) \sim \left(\frac{\varepsilon_{SiO2}}{\varepsilon_{hk}}\right)^2 \cdot \int_{d_{SiO2}}^{d_{hk}} \left(1 - \frac{x}{T_D}\right)^2 \cdot \rho_{hk}(x) dx$$

Equation-12: Total spectral noise power density of drain current is the sum of Equations. 10 and 11 and is given by the following relation:

$$S_{id}(\text{total}) = S_{id}(SiO_2) + S_{id}(hk)$$

Equation-13: By solving Equation 10 for constant trap distribution in the silicon dioxide layer, it can be shown that, $$S_{id}(SiO_2) \sim N_t(SiO_2) \cdot \left[d_{SiO2} - \frac{d_{SiO2}^2}{T_D} + \frac{1}{3} \cdot \frac{d_{SiO2}^3}{T_D^2}\right]$$

Equation-14: Solving Equation 11 for constant trap distribution in the high-k dielectric $$S_{id}(hk) \sim N_t(hk) \cdot \left(\frac{\varepsilon_{SiO2}}{\varepsilon_{hk}}\right)^2 \cdot \left[(T_D - d_{SiO2}) - \frac{T_D^2 - d_{SiO2}^2}{T_D} + \frac{1}{3} \cdot \frac{T_D^3 - d_{SiO2}^3}{T_D^2}\right]$$

Equation-15: By adding Equations 13 and 14, the following equation is obtained:

$$S_{id} \sim N_t(hk) \cdot \left(\frac{\varepsilon_{SiO2}}{\varepsilon_{hk}}\right)^2 \cdot \frac{1}{3} \cdot T_D + d_{SiO2} \cdot \left(N_t(SiO_2) - N_t(hk) \cdot \left(\frac{\varepsilon_{SiO2}}{\varepsilon_{hk}}\right)^2\right) +$$
$$\frac{d_{SiO2}^2}{T_D} \cdot \left(N_t(hk) \cdot \left(\frac{\varepsilon_{SiO2}}{\varepsilon_{hk}}\right)^2 - N_t(SiO_2)\right) +$$
$$\frac{1}{3} \cdot \frac{d_{SiO2}^3}{T_D^2} \cdot \left(N_t(SiO_2) - N_t(hk) \cdot \left(\frac{\varepsilon_{SiO2}}{\varepsilon_{hk}}\right)^2\right)$$

Equation-16: The above Equation 15 can be further simplified using the relation $N_t(SiO_2) = z \cdot N_t(hk)$, to derive the following equation:

$$S_{id} \sim N_t(hk) \cdot \left(\frac{\varepsilon_{SiO2}}{\varepsilon_{hk}}\right)^2 \cdot \frac{1}{3} \cdot T_D +$$
$$N_t(hk) \cdot \left(z - \left(\frac{\varepsilon_{SiO2}}{\varepsilon_{hk}}\right)^2\right) \cdot d_{SiO2} \left[1 - \frac{d_{SiO2}}{T_D} + \frac{1}{3} \cdot \frac{d_{SiO2}^2}{T_D^2}\right]$$

where, $N_t(hk)$=the number of effective traps in the high-k layer which could also be due to switched bias conditions, $N_t(SiO_2)$=the number of effective trapped electrons in the SiO2 layer (support layer) due to noise reduction by using noise-reducing dopants which could also be due to the switched bias noise effect, "z"=is the ratio between $N_t(SiO_2)$ and $N_t(hk)$ In Equation 16 shown above, $N_t(hk)$ can be different for switched bias conditions and constant bias conditions. Additionally, $N_t(SiO_2)$, the effective traps in SiO2 due to noise reduction by noise reducing dopants may also differ due to the switched bias noise effect. Moreover, the higher potential gradient in the SiO2 layer induced by the high-k layer enhances the switched bias noise effect also for traps nearer to the substrate-oxide interface. Therefore, $N_t(SiO_2)$ may also be different under switched bias and constant bias conditions.

In some embodiments, the described principle of having an increased potential gradient in moving towards the support layer substrate interface can be tailored by a dielectric with a graded dielectric constant starting with the highest dielectric constant at the gate and the lowest dielectric constant at the support layer substrate interface. In some embodiments, the graded dielectric may be fabricated by using different high-k materials having different dielectric constants. In some embodiments, a graded dielectric may be fabricated by providing fluorine doping in a lower portion of the support layer (closer to the substrate) and nitridation in an upper portion of the support layer (farther away from the substrate). In some embodiments, a multilayer structure is used to provide the graded dielectric. In some embodiments, the multilayer structure includes a a material selected from the group consisting of $Al_2O_3$, $GD_2O_3$, $Yb_2O_3$, $Dy_2O_3$, $Nb_2O_5$, $Yb_2O_3$, $La_2O_3$, $TiO_2$, $Ta_2O_5$, $SrTiO_3$, $Ba_xSr_{1-x}TiO_3$, $Zr_xSi_{1-x}O_y$, $HfSi_{1-x}O_y$, HfSiON, $HfZrO_x$, $Al_xZr_{1-x}O_2$, silicon nitride (Si3N4), nitrided silicon oxide, silicon dioxide and fluorinated silicon oxide.

In some embodiments, the material used closest to the gate side of the device has the highest dielectric constant and the material used nearest to the substrate of the device has the lowest dielectric constant. In some embodiments, a nitrided silicon oxide, silicon dioxide, or fluorinated silicon oxide are used at the interface of substrate and gate insulator because using other high-k would lead to unacceptable high trap densities if they are placed directly to the substrate interface.

In some embodiments, the effective number of traps depends on whether the circuit is working under a constant bias circuit or whether it is working under a switching bias condition.

Equation-17: The above Equation 16 may be simplified using the relation $d_{SiO2} = y \cdot T_D$, where y is the thickness contribution of the silicon dioxide layer. The simplified result is given by the following equation:

$$S_{id} \sim N_t(hk) \cdot \left(\frac{\varepsilon_{SiO2}}{\varepsilon_{hk}}\right)^2 \cdot \frac{1}{3} \cdot T_D + N_t(hk) \cdot \left(z - \left(\frac{\varepsilon_{SiO2}}{\varepsilon_{hk}}\right)^2\right) \cdot y \cdot T_D \left[1 - y + \frac{1}{3} \cdot y^2\right]$$

The first term in right hand side of Equation 17 is the noise contribution from high-k layer and the second term in the right hand side of Equation 17 is the noise contribution from the support layer.

For $$\left(z - \left(\frac{\varepsilon_{SiO2}}{\varepsilon_{hk}}\right)^2\right) > zero,$$

it provides an advantage by minimizing the total noise given by Eq. 17 through reduction of the thickness of the silicon dioxide. In this case, the SiO2 layer needs to be made as small as possible while remaining at non-zero still providing the advantage of a gate insulator stack including two materials having different dielectric constants.

If $$\left(z - \left(\frac{\varepsilon_{SiO2}}{\varepsilon_{hk}}\right)^2\right) < 0,$$

it provides an advantage by minimizing the total noise given by Eq. 17 through the increase of the thickness contribution "z" to approach "1" but still having the high-k stack to maintain the advantages of a gate insulator stack by including two materials having different dielectric constants.

Equation-18: Solving Equation 17 for the case $$\left(z - \left(\frac{\varepsilon_{SiO2}}{\varepsilon_{hk}}\right)^2\right) > 0$$

and reaching 10% noise contribution from silicon dioxide layer and 90% from high-k layer, the following equation is be obtained:

$$y \cdot \left[1 - y + \frac{1}{3} \cdot y^2\right] = \frac{1}{10} \cdot \left[\frac{1}{3} \cdot \frac{1}{\left(\frac{\varepsilon_{hk}}{\varepsilon_{SiO2}}\right)^2 \cdot z - 1}\right]$$

Furthermore, Equation 18 gives a relation of the thickness of the silicon dioxide layer with respect the support layer and allows to define a minimum oxide thickness for the case when $$\left(z - \left(\frac{\varepsilon_{SiO2}}{\varepsilon_{hk}}\right)^2\right) > 0.$$

Equation-19: For comparison the noise contribution with high-k dielectric only can be provided by the following equation:

$$S_{id} \sim N_t(hk) \cdot \frac{1}{3} \cdot T_D$$

Equation-20: For comparison the noise contribution with oxide dielectric only (without any fluorine) can be provided by the following equation:

$$S_{id} \sim N_t(SiO_2) \cdot \frac{1}{3} \cdot T_D$$

A noise reduction is achieved in the composite stack of high-k layer and silicon dioxide layer compared to pure high-k if the noise factor in Equation-17 is smaller than noise factor in Equation-19. Comparing the two equations (Equation 17 & 19), it can be shown that as a result of the introduction of the support layer, the noise of the high-k is reduced by the ratio of the square of both dielectric constants. Additionally, a noise reduction in a support layer can be achieved by the use of fluorine or other suitable noise reducing dopants implanted into the support layer.

In the case where $$\left(z - \left(\frac{\varepsilon_{SiO2}}{\varepsilon_{hk}}\right)^2\right) > 0,$$

the thickness of the support layer needs to be as small as possible but not zero. For the case $$\left(z - \left(\frac{\varepsilon_{SiO2}}{\varepsilon_{hk}}\right)^2\right) < 0,$$

the thickness contribution "y" of the silicon dioxide layer should approach almost one. The quantum mechanical tunneling effect provides a mechanism to explain that traps further away from the substrate-oxide interface contribute to lower frequencies compared to traps that are nearer to the substrate-oxide interface 207. In some embodiments, adjustment of the thickness "y" can be used to change the frequency behavior by frequency shaping of a particular semiconductor device.

For switching circuits, the gate stack 202 (FIG. 2), allows for an improved noise reduction capability when compared to having a gate stack with only high-k layer. This is due to the fact that the noise contribution in gate stacks with only high-k is much larger because it is difficult for the traps in the high-k layer to be quenched by a noise-reducing dopant. Consequently, gate stack 202 that has a support layer 206 (as shown in FIG. 2) included within the gate stack has an increased noise response to the switched bias noise effect in comparison to the situation where gate stacks are not provided with a support layer.

The traps in the support layer (such as silicon dioxide) which are near to the substrate-oxide interface 207 shows only small response to the switched bias noise effect because the receive only a small potential variation. But these traps in the oxide are reduced by the noise-reducing dopant. On the other hand, the high-k layer introduces a higher potential gradient which results in a larger potential variation for traps near the substrate oxide interface. By this way the noise reduction due to switched bias noise effect is also enhanced for traps near the substrate oxide interface.

In some embodiments, the silicon dioxide thickness can be varied depending on the different amounts of fluorine or chlorine that are implanted into the substrate 208. Additionally, Fluorine and chlorine has an effect on the growth rate of thermally grown oxide (both of them increase the growth rate). Consequently, in some embodiments, based on the circuit application such as a switching circuit or a non-switching circuits such e.g. a current sources, appropriate noise reduction may be provided by choosing the amount of fluorine or chlorine doping performed on the substrate.

Furthermore, fluorine has the effect of reducing the dielectric constant enhancing the ratio of dielectric constants between support layer and high-k layer.

In some embodiments, the amount of fluorine doped into the substrate may be chosen based on the amount of voltage variations seen during the operation of the circuit that is to be integrated within the semiconductor wafer. In some embodiments, different gate oxide thicknesses may be generated by using different masks. In some embodiments, different gate oxide thicknesses are provided in different areas of the semiconductor wafer. For example, by having fluorine implanted in one part of the semiconductor wafer and chlorine implanted in another portion of the semiconductor wafer varying thicknesses of gate oxides are achieved due to the different crystal growth rates for the areas doped with fluorine and chlorine or different amounts of fluorine or chlorine in different areas. The crystal growth rate for the portion of the support layer present over the area of the substrate doped with the fluorine can be adjusted differently from the crystal growth rate for the portion of the support layer present over the area of the substrate doped with the chlorine.

In some embodiments, the thickness of high-k gate insulator may be varied across the surface of the semiconductor substrate by using a masking process. This will allow for tailoring individually the noise reduction across the semiconductor substrate based on individual noise requirements of devices fabricated on the semiconductor device.

In some embodiments, different devices in different areas of the substrate may have different threshold voltage by intention to reduce noise under switched bias conditions. This provides a benefit for the switched bias noise case because the effect is dependent on the amplitude of the off-voltage in the device. Amplitude of the off-voltage is defined by the amount of gate to source voltage below the threshold voltage.

In MuGFETs the threshold voltage can be adjusted by adjusting the fin width. The larger the width the higher the threshold voltage. In planar bulk CMOS devices the threshold voltage can be adjusted by providing different backbias voltage at the substrate or the respective well in the substrate. In general the threshold voltage can be adjusted by threshold implants.

In the case of a MISFET (metal insulator semiconductor field effect transistor) device using gallium arsenide, indium gallium phosphide (InGaP) and gallium phosphide (GaP) substrates a lower noise may be achieved under switched bias conditions.

Figure 3:
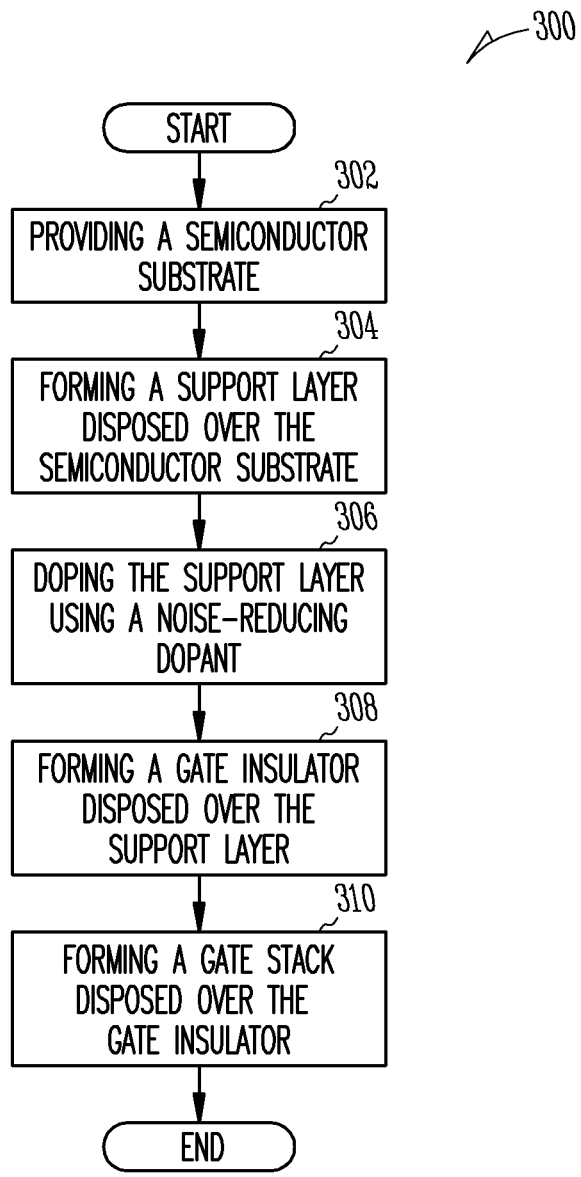
FIG. 3 shows a flow chart illustrating a method of fabricating a semiconductor wafer having a gate insulator formed using a high-k material and a support layer doped with a noise-reducing dopant, according to some embodiments of the invention.

FIG. 3 is a flow chart 300 illustrating a method of fabricating a semiconductor wafer having a gate insulator formed using a high-k material and a support layer doped with a noise-reducing dopant, according to some embodiments of the invention. At 302, method 300 includes providing a semiconductor substrate 102 ready for processing.

At 304, method 300 includes forming a support layer 104 disposed over the semiconductor substrate. Forming support layer 104 includes thermally growing a support layer on the top surface of the semiconductor substrate 102. In some embodiments, the support layer 104 includes any one or combination of materials such as silicon dioxide, nitrided silicon oxide and fluorinated silicon oxide. In some embodiments, the support layer 104 is thermally grown in the same chamber where the HF vapor cleaning is done to prevent native oxide formation on the substrate.

At 306, method 300 includes doping the support layer using a noise-reducing dopant. In some embodiments, doping of the support layer 104 includes fluoridation of the support layer 104 using a plasma fluoridation process to form a doped support layer 110 (FIG. 1G). In alternate embodiments, the supporting layer is chlorinated using a plasma chlorination process. In some embodiments, plasma fluoridation and chlorination of the support layer may be done using chemical materials such as Fluorine ($F_2$), Chlorine ($Cl_2$), $ClF_5$, XeF2, XeF6, SiCl4, NF3 and their respective ions that are generated in a plasma. In some embodiments, plasma fluoridation, chlorination, deuterium or hydrogen incorporation is performed using noble gases that are added with fluorine, chlorine, deuterium or hydrogen containing gases in the plasma chamber.

At 308, method 300 includes forming a gate insulator 112 disposed over the doped support layer 110. In some embodiments, the upper portion of the support layer may be nitrided using a plasma nitridation process. The plasma nitridation process allows for increasing the dielectric constant of the upper portion of the support layer and consequently the combined dielectric of the high-k gate insulator and the support layer remains in the high-k region.

In some embodiments, different support layer thicknesses may be provided by doping different amounts of fluorine or chlorine into the substrate. Doping different amounts of fluorine or chlorine allows for adjusting for noise related to various devices that are fabricated on the semiconductor wafer.

In some embodiments, a first thickness of the support layer is provided for circuits that operate under a constant bias condition and a second thickness if provided for circuits that operate under a switched bias condition. Examples of circuits operating under a constant bias condition includes current minors and similar circuits. Examples of circuits operating under a switched bias condition includes frequency mixers, voltage controlled oscillators, etc.

At 310, method 300 includes forming a gate stack 114 disposed over the gate insulator 112.

Figure 4:
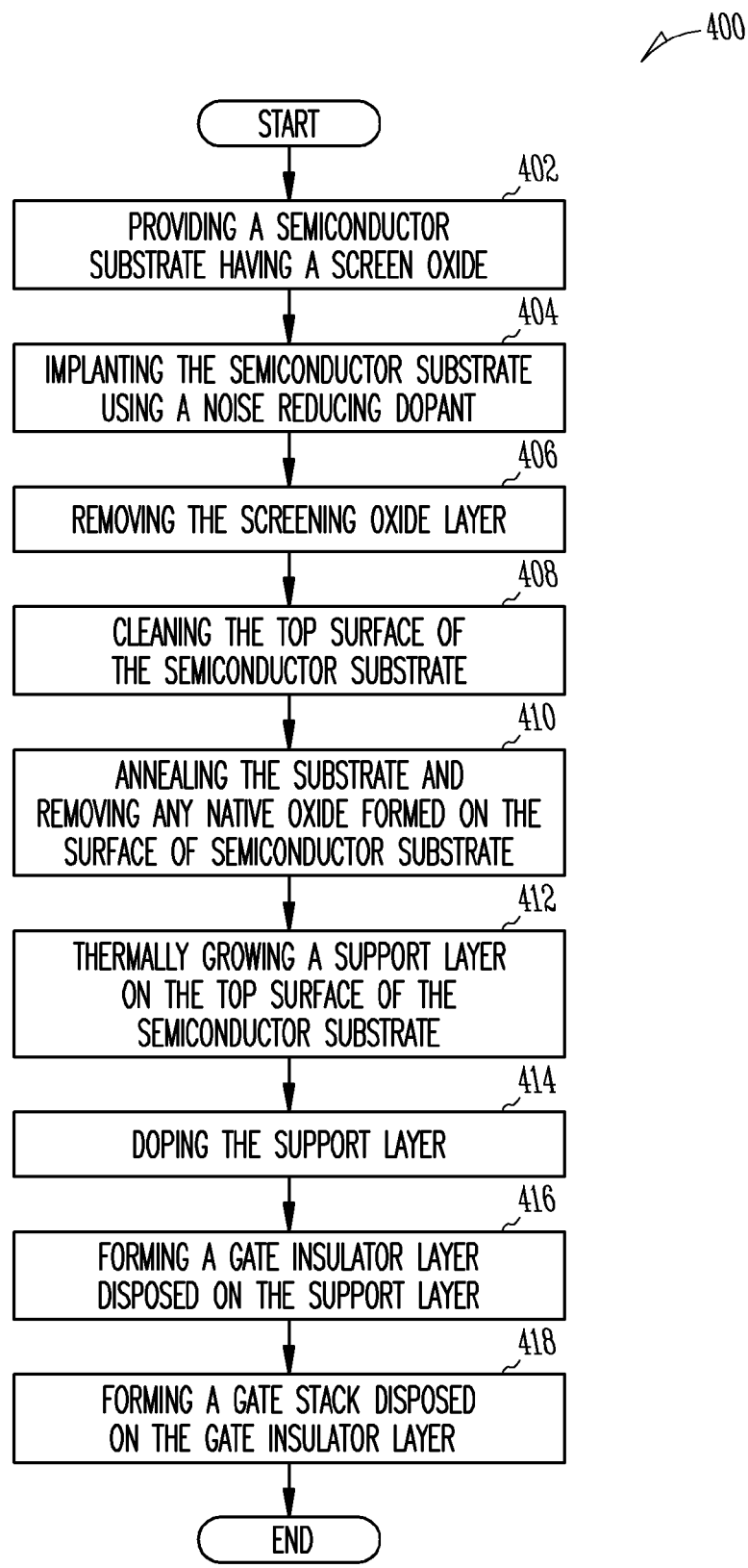
FIG. 4 shows a flow chart illustrating a method of fabricating a semiconductor wafer having a gate insulator formed using a high-k material and having the substrate and a support layer doped with a noise-reducing dopant, according to some embodiments of the invention.

FIG. 4 shows a flow chart 400 illustrating a method of fabricating a semiconductor wafer having a gate insulator formed using a high-k material and having the substrate and a support layer doped with a noise-reducing dopant, according to some embodiments of the invention.

At 402, method 400 includes providing a semiconductor substrate 102 having a screening oxide layer 104 over substrate 102.

At 404, method 400 includes implanting the semiconductor substrate 102 with a noise reducing dopant by ion implantation. In some embodiments, the materials used for noise reducing dopant includes anyone or combination of materials and their respective ions such as Fluorine, Boron difluoride ($BF_2$), Boron trifluoride ($BF_3$), $PF_3$, $PF_5$, $AsF_3$, $AsF_5$, $SbF_3$, $SbF_5$, $XeF_2$, Xenon hexafluoride ($XeF_6$), SiF, Chlorine, Boron trichloride ($BCl_3$), $ClF_5$, $SiCl_4$, Deuterium, Hydrogen and their respective ions generated in a plasma including at least one fluorine, chlorine, deuterium or hydrogen atom.

At 406, method 400 includes removing the screening oxide layer 104 using a wet hydrogen fluoride (HF) dip.

At 408, method 400 includes cleaning the top surface of the semiconductor substrate 102 using ammonium hydrogen peroxide water.

At 410, method 400 includes annealing semiconductor substrate 102 and removing any native oxide formed on the surface of substrate 102 with HF vapor. In some embodiments, annealing substrate 102 includes maintaining the semiconductor wafer at a temperature between about 950° C. and about 1200° C. for a time period between about 1 second and about 60 seconds.

At 412, method 400 includes thermally growing a support layer 108 on the top surface of the doped semiconductor substrate 106 (FIG. 1D). In some embodiments, support layer 108 includes any one or combination of materials such as silicon dioxide, nitrided silicon oxide and fluorinated silicon oxide. In some embodiments, the support layer is thermally grown in the same chamber where the HF vapor cleaning is done to prevent native oxide formation on the substrate.

At 414, method 400 includes doping the support layer 108 to form doped support layer 110 (FIG. 1F). In some embodiments, support layer 108 is fluorinated using a plasma fluoridation process. In alternate embodiments, support layer 108 is chlorinated using a plasma chlorination process. In some embodiments, plasma fluoridation and chlorination of support layer 108 may be performed using chemical materials such as Fluorine ($F_2$), Chlorine ($Cl_2$), $ClF_5$, XeF2, XeF6, SiCl4, NF3 and their respective ions that are generated in a plasma. In some embodiments, plasma fluoridation, chlorination, deuterium or hydrogen incorporation is performed using noble gases that are added with fluorine, chlorine, deuterium or hydrogen containing gases in the plasma chamber.

In some embodiments, the upper portion of support layer 108 may be nitrided using a plasma nitridation process. The plasma nitridation process allows for increasing the dielectric constant of the upper portion of support layer 108 and consequently the combined dielectric of the high-k gate insulator 112 (FIG. 1G) and the doped support layer 110 remains in the high-k region.

In some embodiments, different support layer thicknesses may be provided by doping different amounts of fluorine or chlorine into the substrate. Doping different amounts of fluorine or chlorine allows for adjusting for noise related to various devices that are fabricated on the semiconductor wafer.

In some embodiments, a first thickness of the support layer 110 is provided for circuits that operate under a constant bias condition and a second thickness if provided for circuits that operate under a switched bias condition. Examples of circuits operating under a constant bias condition includes current minors and similar circuits. Examples of circuits operating under a switched bias condition includes frequency mixers, voltage controlled oscillators, etc.

At 414, method 400 includes forming a gate insulator layer 112 disposed on the support layer. In some embodiments, gate insulator layer 112 has a dielectric constant greater than support layer 110. In some embodiments, the gate insulator layer 112 includes any one or combination of the materials and their respective ions such as $Al_2O_3$, $GD_2O_3$, $Yb_2O_3$, $Dy_2O_3$, $Nb_2O_5$, $Yb_2O_3$, $La_2O_3$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, HfSiON, $HfZrO_x$, $Al_xZr_{1-x}O_2$, nitrided silicon oxide or silicon nitride Si3N4.

In some embodiments, the gate insulator material is deposited using a atomic layer deposition process. In alternate embodiments, the gate insulator material is deposited using a metal organic chemical vapor deposition process.

In some embodiments, the thickness of high-k gate insulator may be varied across the surface of the semiconductor substrate by using a masking process. This will allow for tailoring individually the noise reduction across the semiconductor substrate based on individual noise requirements of devices fabricated on the semiconductor device.

In some embodiments, a nitrided silicon oxide is formed as a high-k portion of the support layer. In some embodiments, the nitridation of the silicon dioxide is performed to a different depth.

At 416, method 400 includes forming a gate stack 114 disposed on the gate insulator layer 112.

In some embodiments, the integrated circuit fabricated according the method described above includes at least one of a planar CMOS FET, a fin FET containing two conducting planes (MOSFET channels) and a multi-gate FET containing 3, 4 or 5 conducting planes.

It should be noted that the methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including", but not limited to . . . ".

The Abstract of the Disclosure is provided to comply with 37 C.F.R. §1.72(b), requiring the abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method comprising:
   forming a gate insulator disposed over a semiconductor substrate;
   plasma doping at least one of the gate insulator or the semiconductor substrate with a noise-reducing dopant using a plasma;
   forming a gate stack disposed over the gate insulator;
   wherein forming the gate insulator includes forming a first portion having a first support layer thickness configured to operate under a constant bias condition and forming a second portion having a second support layer thickness configured to operate under a switched bias condition; and wherein the gate stack is disposed over the first and second portions of the gate insulator.

2. The method of claim 1, wherein forming at least one of the first and second portions includes forming a support layer over the semiconductor substrate and forming a high-k dielectric layer over the support layer, wherein the dielectric constant of the high-k dielectric layer is greater than the dielectric constant of the support layer.

3. The method of claim 2, wherein forming the support layer further comprises:
annealing the semiconductor substrate;
removing native oxide using hydrogen fluoride (HF) vapor in a chamber; and
thermally growing the support layer in the chamber.

4. The method of claim 1, wherein plasma doping at least one of the gate insulator or the semiconductor substrate includes plasma doping a support layer of at least one of the first and second portions of the gate insulator.

5. The method of claim 4, wherein plasma doping the support layer includes plasma doping the support layer using a material selected from the group consisting of Fluorine, Chlorine, $ClF_5$, $SiCl_4$, $XeF_2$, Xenon hexafluoride $XeF_6$, $NF_3$, and their respective ions generated in a plasma.

6. The method of claim 1, wherein forming the first portion includes thermally growing a first material over a first portion of the substrate layer, and forming the second portion includes thermally growing a second material over a second portion of the substrate layer, wherein the first portion of the substrate includes a first noise reducing dopant and the second portion of the substrate includes a second noise-reducing dopant.

7. The method of claim 2, wherein forming the support layer disposed over the semiconductor substrate includes forming the support layer by thermally growing silicon dioxide.

8. The method of claim 7, wherein forming the support layer disposed over the semiconductor substrate includes forming a nitrided silicon oxide layer within the support layer.

9. The method of claim 8, wherein forming a nitrided silicon oxide layer includes using a plasma nitridation process.

10. The method of claim 2, wherein forming the high-k dielectric layer disposed over the support layer includes forming the high-k dielectric layer using a material selected from the group consisting of $Al_2O_3$, $GD_2O_3$, $Yb_2O_3$, $Dy_2O_3$, $Nb_2O_5$, $Yb_2O_3$, $La_2O_3$, $TiO_2$, $Ta_2O_5$, $SrTiO_3$, $Ba_xSr_{1-x}TiO_3$, $Zr_xSi_{1-x}O_y$, HfSiON, $HfZrO_x$, $Al_xZr_{1-x}O_2$, nitrided silicon oxide, silicon nitride ($Si_3N_4$).

11. The method of claim 1, further comprising removing an oxide layer covering the semiconductor substrate using a wet hydrogen fluoride (HF) dip process prior to forming the gate insulator.

12. The method of claim 11, wherein removing the oxide layer includes cleaning the semiconductor substrate using a cleaning agent including ammonia hydrogen peroxide water.

13. The method of claim 12, wherein removing the native oxide layer further comprises cleaning the semiconductor substrate using a cleaning agent including HF vapor.

14. The method of claim 1, wherein forming the gate stack disposed over the gate insulator layer includes forming the gate stack using at least one of a poly silicon gate, a fully silicided gate or a metal gate.

15. The method of claim 1, wherein plasma doping at least one of the gate insulator or the semiconductor substrate includes plasma doping the semiconductor substrate using a noise-reducing dopant.

16. The method of claim 15, wherein plasma doping the semiconductor substrate includes implanting the semiconductor substrate with a material selected from the group consisting of Fluorine, $PF_3$, $PF_5$, $AsF_3$, $AsF_5$, $SbF_3$, $SbF_5$, Chlorine, Boron trichloride $BCl_3$, $ClF_5$, SiF, $SiCl_4$, $XeF_2$, Xenon hexafluoride $XeF_6$ and their respective ions generated in a plasma.

17. The method of claim 15, wherein plasma doping the semiconductor substrate includes implanting the semiconductor substrate with Boron difluoride $BF_2$, and its respective ions generated in a plasma.

18. A method of fabricating an integrated circuit comprising:
plasma doping a semiconductor substrate with a noise reducing dopant using a plasma;
forming a support layer disposed over a semiconductor substrate;
forming a high-k dielectric layer disposed over the support layer; and
forming a gate stack disposed over the high-k dielectric layer.

19. The method of claim 18, wherein plasma doping the semiconductor substrate includes implanting the semiconductor substrate with a material selected from the group consisting of Fluorine, $PF_3$, $PF_5$, $AsF_3$, $AsF_5$, $SbF_3$, $SbF_5$, Chlorine, Boron trichloride (BCl3), $ClF_5$, SiF, $SiCl_4$, $XeF_2$, Xenon hexafluoride $XeF_6$ and their respective ions generated in a plasma.

20. The method of claim 18, wherein plasma doping the semiconductor substrate includes implanting the semiconductor substrate with Boron difluoride $BF_2$, and its respective ions generated in a plasma.

21. The method of claim 18, wherein forming the support layer includes thermally growing an oxide layer on the semiconductor substrate.

22. The method of claim 21, wherein forming the support layer includes annealing the semiconductor substrate and the oxide layer to diffuse the noise reducing dopant from the semiconductor substrate to the oxide layer.

23. A method of fabricating an integrated circuit, comprising:
forming a support layer over a semiconductor substrate;
plasma doping the support layer using a noise-reducing dopant;
forming a high-k layer disposed over the support layer, wherein the dielectric constant of the high-k layer is greater than the dielectric constant of the support layer; and
forming a gate stack disposed over the high-k layer.

24. The method of claim 23, wherein plasma doping the support layer includes plasma doping the support layer using a material selected from the group consisting of Fluorine, Chlorine, $ClF_5$, $SiCl_4$, $XeF_2$, Xenon hexafluoride $XeF_6$, $NF_3$ and their respective ions generated in a plasma.

25. The method of claim 23, wherein plasma doping the support layer includes nitriding a portion of the support layer proximate the high-k dielectric layer.

26. The method of claim 23, wherein nitriding includes plasma nitriding a portion of the support layer proximate the high-k dielectric layer.

* * * * *

UNITED STATES PATENT AND TRADEMARK OFFICE
CERTIFICATE OF CORRECTION

PATENT NO. : 8,431,468 B2  
APPLICATION NO. : 12/895401  
DATED : April 30, 2013  
INVENTOR(S) : Domagoj Siprak Page 1 of 1

It is certified that error appears in the above-identified patent and that said Letters Patent is hereby corrected as shown below:

On the Title page, in column 2, under "Other Publications", line 8, delete "11." and insert --11 pgs.--, therefor On Title page 2, in column 1, under "Other Publications", line 1, delete "Mailed" and insert --mailed--, therefor On Title page 2, in column 1, under "Other Publications", line 9, after "Meeting," delete "2005.,", therefor On Title page 2, in column 1, under "Other Publications", line 13, delete "T," and insert --T.,--, therefor On Title page 2, in column 1, under "Other Publications", line 16, delete "11/635,709" and insert --11/635,709,--, therefor In the Claims In column 15, line 25, in claim 5, delete "ClIF$_5$" and insert --ClF$_5$--, therefor In column 15, line 49, in claim 10, delete "Ba$_x$Sr$_{1-x}$, TiO$_3$," and insert --Ba$_x$Sr$_{1-x}$TiO$_3$,--, therefor In column 15, line 50, in claim 10, before "HfSiON", insert --Hf$_x$Si$_{1-x}$O$_y$,--, therefor In column 16, line 30, in claim 19, delete "(BCl3)" and insert --(BCl$_3$)--, therefor Signed and Sealed this  
Thirty-first Day of December, 2013

Margaret A. Focarino  
*Commissioner for Patents of the United States Patent and Trademark Office*